(12) United States Patent
Li

(10) Patent No.: US 11,049,914 B2
(45) Date of Patent: Jun. 29, 2021

(54) DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Wenqi Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/612,401

(22) PCT Filed: Sep. 25, 2019

(86) PCT No.: PCT/CN2019/107656
§ 371 (c)(1),
(2) Date: Nov. 11, 2019

(87) PCT Pub. No.: WO2021/003849
PCT Pub. Date: Jan. 14, 2021

(65) Prior Publication Data
US 2021/0005675 A1    Jan. 7, 2021

(30) Foreign Application Priority Data

Jul. 5, 2019   (CN) .......................... 201910604055.6

(51) Int. Cl.
*H01L 27/32* (2006.01)
*G06F 3/041* (2006.01)
*G09F 9/30* (2006.01)
*H01L 51/52* (2006.01)

(52) U.S. Cl.
CPC .......... *H01L 27/323* (2013.01); *G06F 3/0412* (2013.01); *G09F 9/301* (2013.01); *H01L 51/5293* (2013.01)

(58) Field of Classification Search
CPC . H01L 27/323; H01L 51/5293; G06F 3/0412; G09F 9/301
See application file for complete search history.

(56) References Cited

U.S. PATENT DOCUMENTS

| 2017/0176835 | A1* | 6/2017 | Gupta | G02F 1/1679 |
| 2017/0184897 | A1* | 6/2017 | Rho | G02F 1/13452 |
| 2017/0331071 | A1* | 11/2017 | Han | B32B 27/06 |
| 2018/0011567 | A1* | 1/2018 | Den Boer | G06F 3/0446 |
| 2018/0107250 | A1 | 4/2018 | Cho | |

(Continued)

FOREIGN PATENT DOCUMENTS

| CN | 107093606 | 8/2017 |
| CN | 107728365 | 2/2018 |

(Continued)

*Primary Examiner* — Andrew Sasinowski

(57) ABSTRACT

A display panel comprises a display area, a bending area and a bonding area. The bending area is connected to the bonding area and the display area, the bonding area is disposed under the display area, and the bonding area is attached to the display area by at least one glass substrate. A glass substrate is substituted for current support layer in the bonding area. The glass substrate has a greater hardness compared to the support layer, and can reduce damages to the terminals in the bonding area caused by an external force.

10 Claims, 4 Drawing Sheets

(56) References Cited

U.S. PATENT DOCUMENTS

2019/0129229 A1    5/2019  Cui et al.
2019/0161630 A1*   5/2019  Kim .................... H01L 27/323
2020/0013840 A1    1/2020  Ko et al.

FOREIGN PATENT DOCUMENTS

| CN | 108666286 | 10/2018 |
| CN | 108762562 | 11/2018 |
| CN | 108877528 | 11/2018 |
| CN | 109215511 | 1/2019  |
| CN | 109524433 | 3/2019  |
| CN | 109559644 | 4/2019  |

* cited by examiner

DISPLAY PANEL AND MANUFACTURING METHOD THEREOF

RELATED APPLICATIONS

This application is a National Phase of PCT Patent Application No. PCT/CN2019/107656 having International filing date of Sep. 25, 2019, which claims the benefit of priority of Chinese Patent Application No. 201910604055.6 filed on Jul. 5, 2019. The contents of the above applications are all incorporated by reference as if fully set forth herein in their entirety.

FIELD AND BACKGROUND OF THE INVENTION

The present disclosure relates to the field of display technologies, and more particularly to a display panel and a manufacturing method thereof.

Current chip packaging technology for display panel products has three kinds of structural designs: chip on glass (COG), chip on panel (COP), and chip on film (COF). Compared to liquid crystal display (LCD), organic light-emitting diodes (OLEDs) have advantages of flexibility, self-luminescence, thinness, and short response times, gradually attracting attention, and are widely regarded as the application panels of next-generation mainstream display devices.

In OLED technology, structural designs of COP and COF are mainly used in panel chip packaging. FIG. 1 and FIG. 2 are schematic diagrams of panel packaging designs of COP and COF. In the structural design of COP, an IC bonding area and an FPC bonding area are fabricated under a panel. In the structural design of COF, a COF bonding area is fabricated under the panel. In latter stage of process, in order to increase screen ratio and reduce size of frame, the COF area, IC area, FPC area and other circuits under the panel are all bent to a rear of the panel. Currently, a support layer is attached to bottom of the panel after peeling off a glass substrate from the panel by laser lift-off technology (LLO) in a module segment process to protect the flexible panel. Laser lift-off range is the whole panel. In a bending process, terminals under a bending area and bonded in the module segment process, such as IC, FPC, and COF, are damaged easily because the panel undergoes greater pressure during the process, and the support layer cannot suffer excessive pressure in general.

Therefore, it is necessary to provide a new display panel to improve safety in the bonding area and resolve the problem of damaged bonding area in current display panels.

SUMMARY OF THE INVENTION

An object of the present disclosure is to provide a display panel and a manufacturing method thereof by substituting a glass substrate for current support layer in the bonding area. The glass substrate has a greater hardness compared to the support layer, thereby it reducing damages to the terminals in the bonding area by an external force after the laser lift-off to the finished product transportation process.

An embodiment of the present disclosure provides a display panel. The display panel comprises a display area, a bending area, and a bonding area; wherein the bending area is connected to the bonding area and the display area, the bending area and the bonding area are disposed under the display area, and the bonding area is attached to the display area by at least one glass substrate using the bending area.

In an embodiment of the present disclosure, the bonding area comprises: a first base layer disposed on one side of the glass substrate away from the display area; a pad area disposed on one side of the first base layer away from the glass substrate; and a bonded component disposed on one side of the pad area away from the first base layer.

In an embodiment of the present disclosure, the bonded component comprises: an integrated circuit disposed on one side of the pad area away from the first base layer; and a flexible circuit board disposed on one side of the pad area away from the first base layer; the integrated circuit and the flexible circuit board are disposed on a same layer and bonded to the bonding area.

In an embodiment of the present disclosure, the bonded component comprises: a chip on film disposed on one side of the pad area away from the first base layer; and a flexible circuit board disposed on one side of the chip on film away from the pad area; the flexible circuit board is bonded to the bonding area by the chip on film.

In an embodiment of the present disclosure, the display area comprises: a middle frame; a support layer disposed on one side of the middle frame away from the glass substrate; a second base layer disposed on one side of the support layer away from the middle frame; an array substrate disposed on one side of the second base layer away from the support layer; an organic light-emitting layer disposed on one side of the array substrate away from the second base layer; a touch screen disposed on one side of the organic light-emitting layer away from the array substrate; and an embedded polarizer disposed on one side of the touch screen away from the organic light-emitting layer; wherein the glass substrate is attached to the middle frame.

In an embodiment of the present disclosure, the bending area comprises a third base layer and an organic layer; the organic layer is disposed on the third base layer.

In an embodiment of the present disclosure, the first base layer, the second base layer, and the third base layer are formed on a same layer; the third base layer is connected to the first base layer and the second base layer.

In an embodiment of the present disclosure, the array substrate, the organic layer, and the pad area are formed on a same layer; the organic layer is connected to the array substrate and the pad area.

In an embodiment of the present disclosure, the first base layer, the second base layer, and the third base layer are made of polyimide.

An embodiment of the present disclosure further provides a manufacturing method of the display panel. The manufacturing method comprises:

providing a glass substrate, a support layer, and a middle frame, wherein the glass substrate comprises a display area, a bending area, and a bonding area, and the bending area is connected to the display area and the bonding area;

disposing a first base layer and a pad area on the glass substrate of the bonding area in sequence;

disposing a second base layer and an array substrate on the glass substrate of the display area in sequence;

disposing a third base layer and an organic layer on the glass substrate of the bending area in sequence;

disposing an organic light-emitting layer, a touch screen, and an embedded polarizer on the array substrate in sequence;

using laser to lift off the glass substrate of the display area and the bending area;

bonding the support layer and the middle frame to one side of the second base layer away from the array substrate;

and bending the bending area to make the glass substrate of the bonding area attach to the display area.

The embodiment of the present disclosure provides the display panel and the manufacturing method thereof by substituting a glass substrate for current support layer in the bonding area. The glass substrate has a greater hardness compared to the support layer, thereby it reducing damages to the terminals in the bonding area by an external force after the laser lift-off to the finished product transportation process. It can omit current step of bonding the bonding area to the support layer, and simplify the process of bonding the support layer from two steps to one step by preserving the glass substrate in the bonding area when using laser to lift off the glass substrate in the display area and the bending area.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DESCRIPTION OF SPECIFIC EMBODIMENTS OF THE INVENTION

Figure 1:
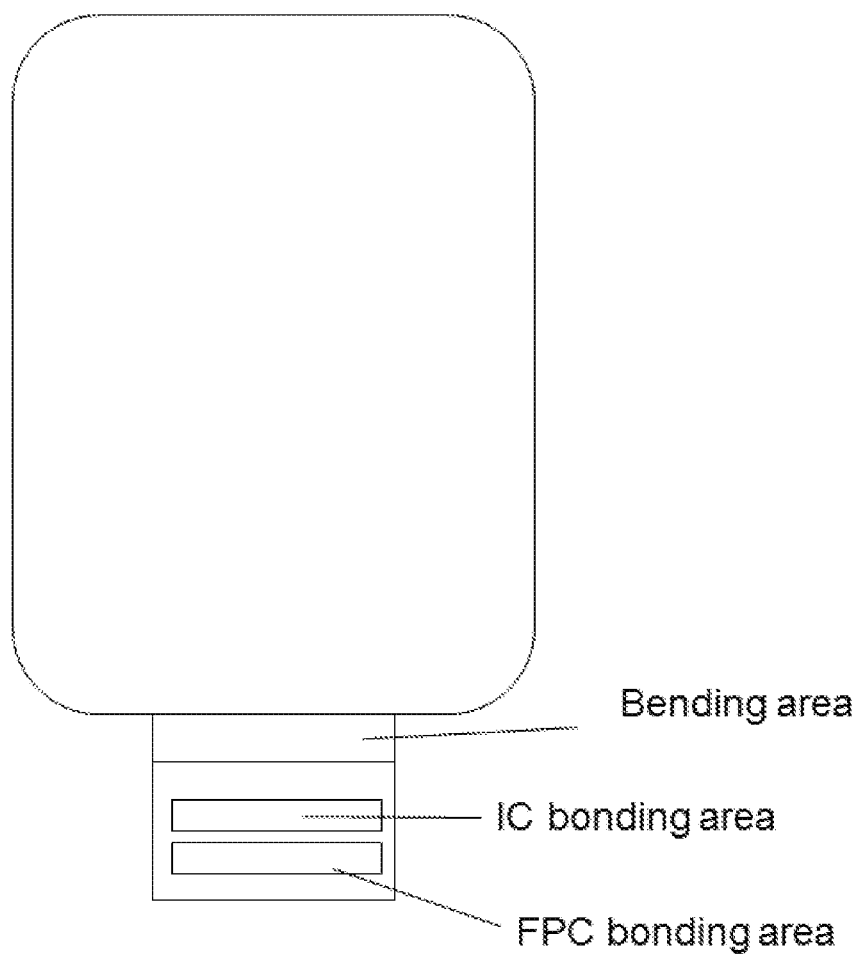
FIG. 1 is a schematic plan diagram of a current COP structure.
Figure 2:
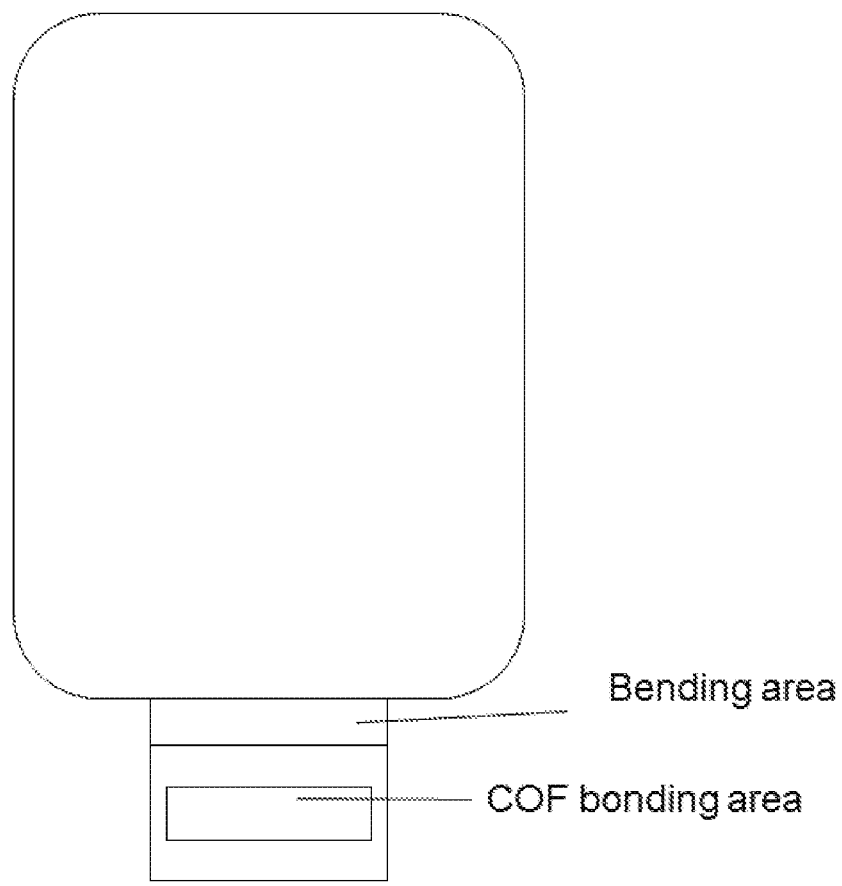
FIG. 2 is a schematic plan diagram of a current COF structure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, and shall not be construed as causing limitations to the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivatives thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply inclusion of one or more than one of these features. In the description of the present disclosure, "a plurality of" relates to two or more than two, unless otherwise specified.

In the description of the present disclosure, it should be noted that unless there are expressed rules and limitations, the terms such as "mount", "connect", and "bond" should be comprehended in broad sense. For example, it can mean a permanent connection, a detachable connection, or an integrate connection; it can mean a mechanical connection, an electrical connection, or communication with each other; and it can mean a direct connection, an indirect connection by an intermediate, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on", "above", or "on top of" a second feature may include an embodiment in which the first feature is directly "on", "above", or "on top of" the second feature, and may also include an embodiment in which the first feature is not directly "on", "above", or "on top of" the second feature, or just means that the first feature has a sea level elevation greater than the sea level elevation of the second feature. The first feature "beneath", "below", or "on bottom of" a second feature may include an embodiment in which the first feature is directly "beneath", "below", or "on bottom of" the second feature and may also include an embodiment in which the first feature is not directly "beneath", "below", or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Figure 3:
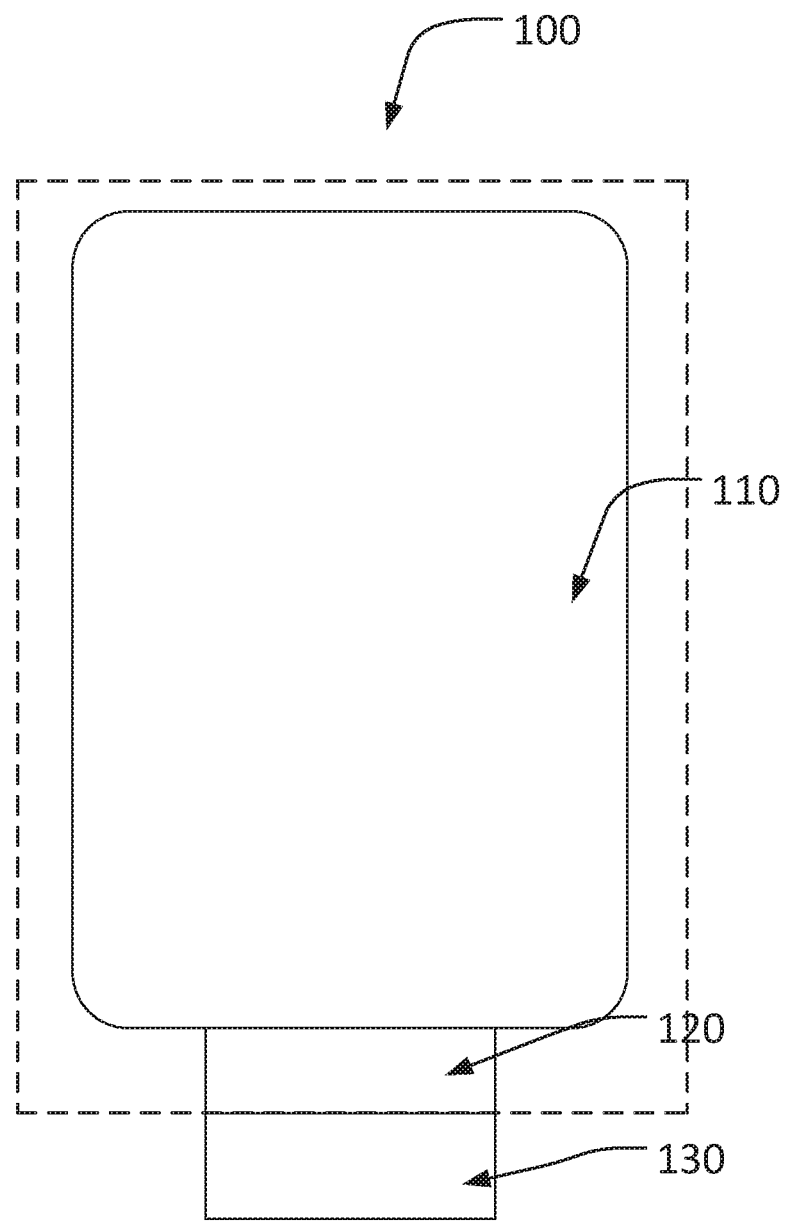
FIG. 3 is a schematic plan diagram of a display panel according to an embodiment of the present disclosure.

As shown in FIG. 3, an embodiment of the present disclosure provides a display panel 100. The display panel 100 comprises a display area 110, a bending area 120, and a bonding area 130.

The bending area 120 is connected to the bonding area 130 and the display area 110. The bending area 120 and the bonding area 130 are disposed under the display area 110.

Figure 4:
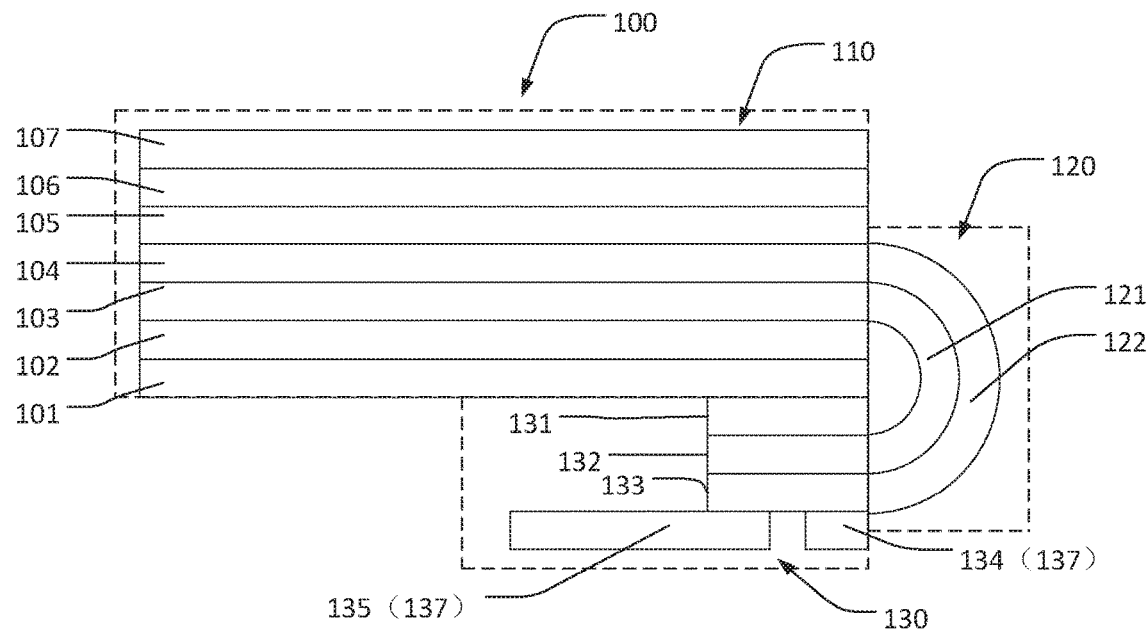
FIG. 4 is a schematic structural diagram of a display panel according to an embodiment of the present disclosure.

As shown in FIG. 4, the bonding area 130 comprises: a glass substrate 131, a first base layer 132, a pad area 133, and a bonded component 137. In the embodiment, the bonding area 130 is a COP packaging structure. The bonding area 130 is attached to the display area 110 by the glass substrate 131.

The first base layer 132 is disposed on one side of the glass substrate away from the display area 110; the first base layer 132 is made of polyimide.

The pad area 133 is disposed on one side of the first base layer 132 away from the glass substrate.

The bonded component 137 is disposed on one side of the pad area 133 away from the first base layer 132. The bonded component 137 comprises an integrated circuit 134 and a flexible circuit board 135.

The integrated circuit 134 is disposed on one side of the pad area 133 away from the first base layer 132. The flexible circuit board 135 is disposed on one side of the pad area 133 away from the first base layer 132.

The integrated circuit 134 and the flexible circuit board 135 are disposed on a same layer and bonded to the pad area 133.

The display area 110 comprises: a middle frame 101, a support layer 102, a second base layer 103, an array substrate 104, an organic light-emitting layer 105, a touch screen 106, and an embedded polarizer 107.

The glass substrate 131 is attached to the middle frame 101.

The support layer 102 is disposed on one side of the middle frame 101 away from the glass substrate.

The second base layer 103 is disposed on one side of the support layer 102 away from the middle frame 101. The second base layer 103 is made of polyimide.

The array substrate 104 is disposed on one side of the second base layer 103 away from the support layer 102.

The organic light-emitting layer 105 is disposed on one side of the array substrate 104 away from the second base layer 103.

The touch screen 106 is disposed on one side of the organic light-emitting layer 105 away from the array substrate 104.

The embedded polarizer 107 is disposed on one side of the touch screen 106 away from the organic light-emitting layer 105.

The bending area 120 comprises: a third base layer 121 and an organic layer 122. The third base layer 121 is made of polyimide. The organic layer 122 is disposed on the third base layer 121, and the organic layer 122 has high resistance to bending strength.

The first base layer 132, the second base layer 103, and the third base layer 121 are formed on a same layer. The third base layer 121 is connected to the first base layer 132 and the second base layer 103.

The array substrate 104, the organic layer 122, and the pad area 133 are formed on a same layer. The organic layer 122 is connected to the array substrate 104 and the pad area 133.

The embodiment of the present disclosure provides the display panel 100 by substituting the glass substrate 131 for current backboard in the bonding area 130. The glass substrate 131 has a greater hardness compared to the support layer 102, and can reduce damages to the terminals in the bonding area 130 caused by an external force to the transportation process of finished product after laser lift-off.

An embodiment of the present disclosure further provides a manufacturing method of a display panel. The method comprises the following steps:

S1: providing a glass substrate, a support layer 102, and a middle frame 101, wherein the glass substrate comprises a display area, a bending area, and a bonding area, and the bending area is connected to the display area and the bonding area.

S2: disposing a first base layer 132 and a pad area 133 on the glass substrate of the bonding area in sequence. The first base layer 132 is made of polyimide.

S3: disposing a second base layer 103 and an array substrate 104 on the glass substrate of the display area in sequence. The second base layer 103 is made of polyimide.

S4: disposing a third base layer 121 and an organic layer 122 on the glass substrate of the bending area in sequence. The third base layer 121 is made of polyimide.

The first base layer 132, the second base layer 103, and the third base layer 121 are formed on a same layer, and the third base layer 121 is connected to the first base layer 132 and the second base layer 103.

The array substrate 104, the organic layer 122, and the pad area 133 are formed on a same layer, and the organic layer 122 is connected to the array substrate 104 and the pad area 133.

S5: disposing an organic light-emitting layer 105, a touch screen 106 and an embedded polarizer 107 on the array substrate 104 in sequence.

S6: using laser to lift off the glass substrate 131 of the display area and the bending area.

S7: bonding the support layer 102 and the middle frame 101 to one side of the second base layer away from the array substrate 104.

S8: bending the third base layer 121 and the organic layer 122 to make the glass substrate 131 of the bonding area attach to the middle frame 101.

The embodiment of the present disclosure provides the manufacturing method of the display panel by substituting the glass substrate 131 for current support layer in the bonding area 130. The glass substrate is originally present in conventional manufacturing process of display panels, and the bottom layer of the panel has a layer of glass substrate in general. By preserving the glass substrate 131 in the bonding area 130 when using laser to lift off the glass substrate in the display area 110 and the bending area 120, the current step of bonding the bonding area 130 to the support layer 102 can be omitted, thereby simplifying the process of bonding the support layer 102 from two steps to one step.

Figure 5:
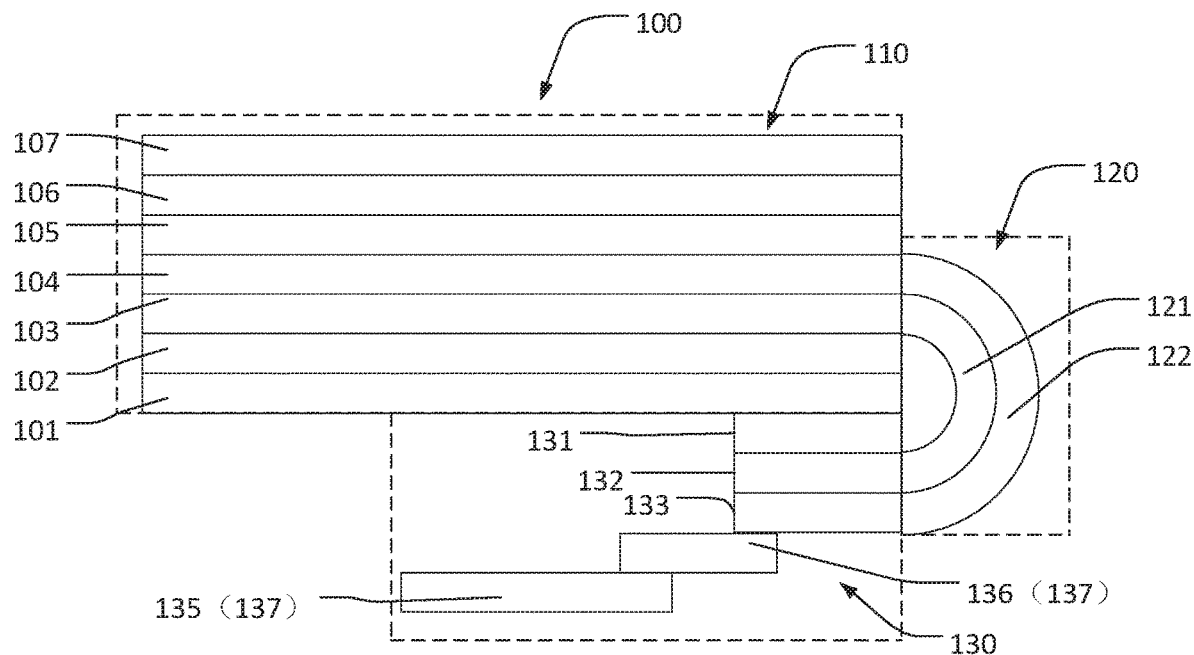
FIG. 5 is a schematic structural diagram of a display panel according to another embodiment of the present disclosure.

As shown in FIG. 5, another embodiment of the present disclosure provides a display panel 100. The difference of the display panel 100 is that the bonding area 130 is a COF packaging structure.

The bonded component 137 comprises a chip on film 136 and a flexible circuit board 135.

The chip on film 136 is disposed on one side of the pad area 133 away from the first base layer 132, the flexible circuit board 135 is disposed on one side of the chip on film 136 away from the pad area 133, and the flexible circuit board 135 is bonded to the pad area 133 by the chip on film 136.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising a display area, a bending area, and a bonding area; wherein
the bending area is directly connected to the bonding area and the display area, the bonding area is directly disposed under the display area, and the bonding area is attached to the display area by at least one glass substrate using the bending area.

2. The display panel according to claim 1, wherein the bonding area comprises:
a first base layer disposed on one side of the glass substrate away from the display area;
a pad area disposed on one side of the first base layer away from the glass substrate; and
a bonded component disposed on one side of the pad area away from the first base layer.

3. The display panel according to claim 2, wherein the bonded component comprises:
an integrated circuit disposed on the one side of the pad area away from the first base layer; and
a flexible circuit board disposed on the one side of the pad area away from the first base layer; wherein the integrated circuit and the flexible circuit board are disposed on a same layer and bonded to the bonding area.

4. The display panel according to claim 2, wherein the bonded component comprises:
a chip on film disposed on the one side of the pad area away from the first base layer; and
a flexible circuit board disposed on one side of the chip on film away from the pad area;
wherein the flexible circuit board is bonded to the bonding area by the chip on film.

5. A display panel, comprising a display area, a bending area, and a bonding area; wherein
the bending area is connected to the bonding area and the display area, the bending area and the bonding area are disposed under the display area, and the bonding area is attached to the display area by at least one glass substrate using the bending area;
wherein the bonding area comprises:
a first base layer disposed on one side of the glass substrate away from the display area;
a pad area disposed on one side of the first base layer away from the glass substrate; and
a bonded component disposed on one side of the pad area away from the first base layer;
the display area comprises:
a middle frame;
a support layer disposed on one side of the middle frame away from the glass substrate;
a second base layer disposed on one side of the support layer away from the middle frame;
an array substrate disposed on one side of the second base layer away from the support layer;
an organic light-emitting layer disposed on one side of the array substrate away from the second base layer;
a touch screen disposed on one side of the organic light-emitting layer away from the array substrate; and
an embedded polarizer disposed on one side of the touch screen away from the organic light-emitting layer; and
wherein the glass substrate is attached to the middle frame.

6. The display panel according to claim 5, wherein the bending area comprises a third base layer and an organic layer, and the organic layer is disposed on the third base layer.

7. The display panel according to claim 6, wherein
the first base layer, the second base layer and the third base layer are formed on a same layer; and
the third base layer is connected to the first base layer and the second base layer.

8. The display panel according to claim 6, wherein
the array substrate, the organic layer, and the pad area are formed on a same layer; and
the organic layer is connected to the array substrate and the pad area.

9. The display panel according to claim 6, wherein
the first base layer, the second base layer, and the third base layer are made of polyimide.

10. A manufacturing method of a display panel, comprising:
providing a glass substrate, a support layer, and a middle frame, wherein the glass substrate comprises a display area, a bending area, and a bonding area, and the bending area is connected to the display area and the bonding area;
disposing a first base layer and a pad area on the glass substrate of the bonding area in sequence;
disposing a second base layer and an array substrate on the glass substrate of the display area in sequence;
disposing a third base layer and an organic layer on the glass substrate of the bending area in sequence;
disposing an organic light-emitting layer, a touch screen, and an embedded polarizer on the array substrate in sequence;
using laser to lift off the glass substrate of the display area and the bending area;
bonding the support layer and the middle frame to one side of the second base layer away from the array substrate; and
bending the bending area to make the glass substrate of the bonding area attach to the display area.

* * * * *